(12) United States Patent
Kim et al.

(10) Patent No.: US 9,099,649 B2
(45) Date of Patent: Aug. 4, 2015

(54) APPARATUS AND METHOD FOR MANUFACTURING ORGANIC LIGHT-EMITTING DIODE DISPLAY

(71) Applicant: SAMSUNG DISPLAY CO., LTD., Yongin, Gyeonggi-Do (KR)

(72) Inventors: Jang Sub Kim, Suwon-si (KR); Geun Tak Kim, Hwaseong-si (KR); Hyea Weon Shin, Seongnam-si (KR); Jae Kwon Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 11 days.

(21) Appl. No.: 14/072,734

(22) Filed: Nov. 5, 2013

(65) Prior Publication Data

US 2015/0024528 A1 Jan. 22, 2015

(30) Foreign Application Priority Data

Jul. 17, 2013 (KR) ........................ 10-2013-0084119

(51) Int. Cl.
| | |
|---|---|
| *H01L 21/02* | (2006.01) |
| *H01L 21/67* | (2006.01) |
| *H01L 51/00* | (2006.01) |
| *H01L 27/32* | (2006.01) |
| *H01L 51/56* | (2006.01) |

(52) U.S. Cl.
CPC ...... *H01L 51/0005* (2013.01); *H01L 21/02288* (2013.01); *H01L 21/6715* (2013.01); *H01L 27/3225* (2013.01); *H01L 27/3248* (2013.01); *H01L 51/56* (2013.01)

(58) Field of Classification Search
CPC .............. H01L 51/0001; H01L 51/002; H01L 51/0004; H01L 51/0005; H01L 21/02288; H01L 21/6715; H01L 27/3225; H01L 27/3248
USPC ............................. 438/24, 28, 29, 34–35, 99
See application file for complete search history.

(56) References Cited

U.S. PATENT DOCUMENTS

2013/0017641 A1* 1/2013 Goda .............................. 438/46

FOREIGN PATENT DOCUMENTS

| JP | 2009-251487 A | 10/2009 |
|---|---|---|
| KR | 10-2007-0055328 A | 5/2007 |
| KR | 10-2007-0121982 | 12/2007 |

* cited by examiner

*Primary Examiner* — Thanhha Pham
(74) *Attorney, Agent, or Firm* — Christie, Parker & Hale, LLP

(57) ABSTRACT

Provided are an apparatus for manufacturing an OLED display and a method of manufacturing OLED display. According to another aspect of the present invention, there is provided the method of manufacturing an OLED display which includes placing a substrate having rows and columns of pixels through on a stage, ejecting organic light-emitting ink to the pixels through on the substrate by using a print head placed above the stage, and sequentially covering pixels through coated with the organic light-emitting ink with a cover plate placed above the stage.

9 Claims, 13 Drawing Sheets

APPARATUS AND METHOD FOR MANUFACTURING ORGANIC LIGHT-EMITTING DIODE DISPLAY

This application claims priority from Korean Patent Application No. 10-2013-0084119 filed on Jul. 17, 2013 in the Korean Intellectual Property Office, the disclosure of which is incorporated herein by reference in its entirety.

BACKGROUND OF THE INVENTION

1. Field of the Invention

The present invention relates to an apparatus for manufacturing an organic light-emitting diode (OLED) display and a method of manufacturing an OLED display using the apparatus, and more particularly, to an apparatus for manufacturing an OLED display in which an organic layer is formed on a substrate and a method of manufacturing an OLED display using the apparatus.

2. Description of the Related Art

Displays for displaying various information on the screen are core technology of the information and communications age and are evolving into thinner, lighter, portable, and high-performance displays. In particular, flat panel displays such as organic light-emitting diode (OLED) displays are drawing a lot of attention because they can overcome disadvantages of cathode ray tubes (CRTs), that is, reduce the weight and volume of the CRTs. An OLED is a self-emitting device that uses a thin organic light-emitting layer disposed between electrodes and can be made as thin as paper. OLED displays may be divided into small molecule OLED displays and polymer OLED displays according to the material of an organic light-emitting layer that generates light. An organic light-emitting layer of a small molecule OLED display is generally formed in the form of a thin film by vacuum deposition, and an organic light-emitting layer of a polymer OLED display is formed in the form of a thin film by a solution coating method such as spin coating or inkjet printing.

If inkjet printing is used to form an organic light-emitting layer, an inkjet print head may eject organic light-emitting ink which contains an organic light-emitting material and a solvent to at least one pixel on a display area of a substrate, and the ejected organic light-emitting ink may dry to form the organic light-emitting layer. Here, when the organic light-emitting ink dries, it may mean that the solvent contained in the organic light-emitting ink evaporates. Generally, a solvent is highly volatile. Therefore, the solvent may be volatilized soon after the ejection of the organic light-emitting ink, thereby drying the organic light-emitting ink. Here, due to a difference in drying time between a region coated first with the organic light-emitting ink and a region coated later with the organic light-emitting ink, the region coated first with the organic light-emitting ink and the region coated later with the organic light-emitting region may have different drying profiles. If the organic light-emitting layer disposed in pixels on the substrate has different drying profiles due to the difference in the drying time of the organic light-emitting ink, a thickness of the organic light-emitting layer may become non-uniform across all regions of the substrate. This can directly affect the display quality of an OLED display.

SUMMARY OF THE INVENTION

Aspects of the present invention provide an apparatus for manufacturing an organic light-emitting diode (OLED) display, the apparatus capable of reducing a difference in drying time of organic light-emitting ink on all regions of a substrate.

Aspects of the present invention also provide a method of manufacturing an OLED display, the method capable of reducing a difference in drying time of organic light-emitting ink on all regions of a substrate.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided the apparatus for manufacturing an OLED display which includes a stage on which a substrate is placed, a print head which is placed above the stage, a moving unit which moves the print head or the stage, and a cover plate which is placed above the stage and covers at least part of a top surface of the substrate.

According to another aspect of the present invention, there is provided the method of manufacturing an OLED display which includes placing a substrate having rows and columns of pixels through on a stage, ejecting organic light-emitting ink to the pixels through on the substrate by using a print head placed above the stage, and sequentially covering pixels through coated with the organic light-emitting ink with a cover plate placed above the stage.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1:
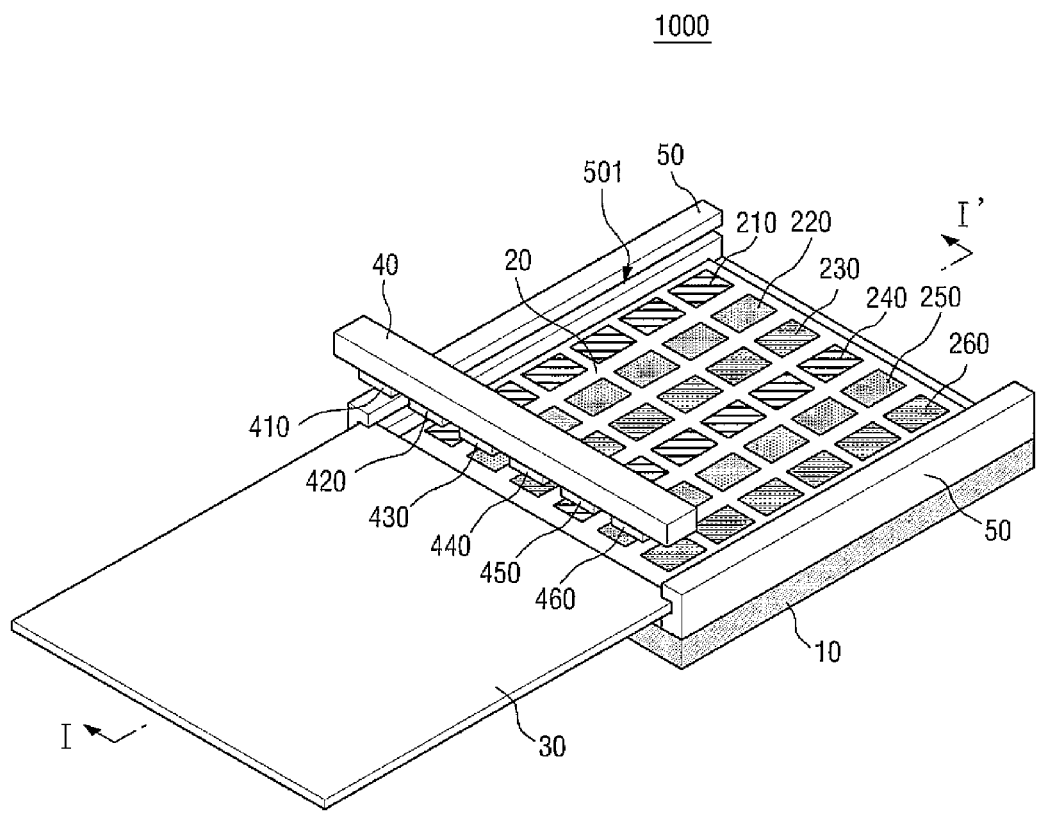
FIG. 1 is a perspective view of an apparatus for manufacturing an organic light-emitting diode (OLED) display according to an embodiment of the present invention.

The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the present invention, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, embodiments of the present invention will be described with reference to the attached drawings.

Figure 2:
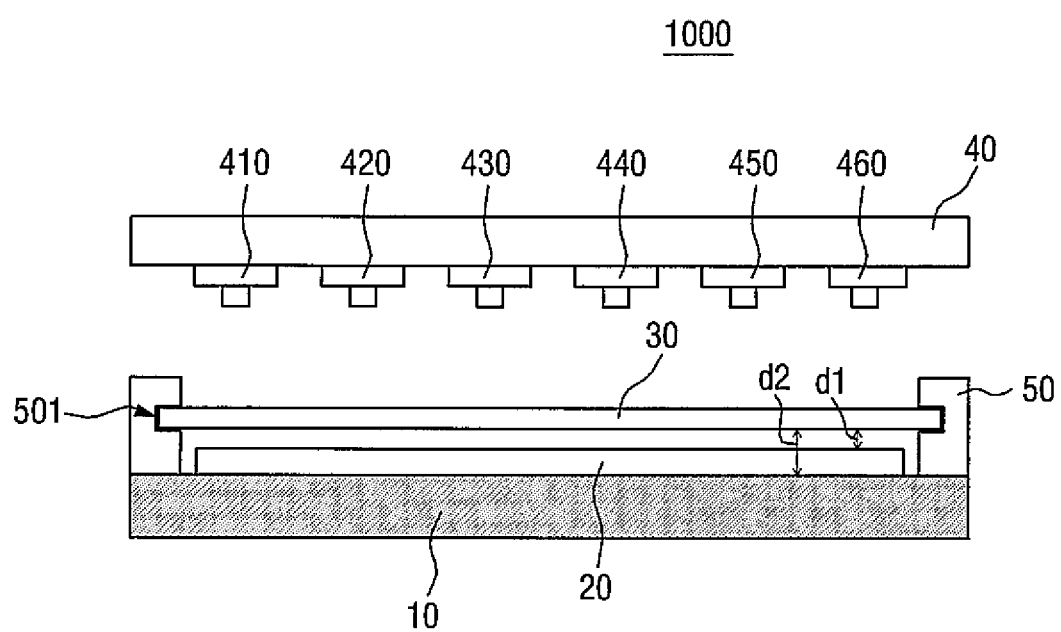
FIG. 2 is a side view of the apparatus for manufacturing an OLED display according to the embodiment of FIG. 1.

FIG. 1 is a perspective view of an apparatus 1000 for manufacturing an organic light-emitting diode (OLED) display according to an embodiment of the present invention. FIG. 2 is a side view of the apparatus 1000 for manufacturing an OLED display according to the embodiment of FIG. 1.

Referring to FIGS. 1 and 2, the apparatus 1000 for manufacturing an OLED display according to the current embodiment includes a stage 10 on which a substrate 20 is placed, a print head 40 which is placed above the stage 10, a moving unit (not shown) which moves the print head 40 or the stage 10, and a cover plate 30 which is placed above the stage 10 and covers at least part of a top surface of the substrate 20.

The stage 10 may support the substrate 20 and may be formed of a rigid material. In an exemplary embodiment, the stage 10 may be shaped like a rectangular parallelepiped. However, the shape of the stage 10 is not limited to the rectangular parallelepiped. The shape of the stage 10 may also be a circle or at least partially include a curve.

The substrate 20 may be placed on the stage 10. The substrate 20 may include a base substrate, driving thin-film transistors (not shown), and an insulating layer (not shown). The base substrate may be formed of, but not limited to, transparent glass, plastic sheet or silicon.

The substrate 20 may be a unit display substrate or may be a mother substrate before being cut into a plurality of unit display substrates. The substrate 20 may be a single substrate or a stack of substrates.

A plurality of pixels 210 through 260 may be defined on the substrate 20. The pixels 210 through 260 may be rectangular. The pixels 210 through 260 may be arranged in an n×m matrix, where n and m are integers of one or greater. In the exemplary embodiment of FIG. 1, assuming that a row direction is an x direction and a column direction is a y direction, the pixels 210 through 260 may be arranged on the substrate 20 in a 6×6 matrix. However, the arrangement of the pixels 210 through 260 shown in FIG. 1 is merely an example, and more pixels than the pixels 210 through 260 shown in FIG. 1 may actually be arranged on the substrate 20. In addition, the pixels 210 through 260 may be arranged not only in the matrix pattern but also in various patterns including a stripe pattern and a pentile pattern.

An anode may be formed in each pixel. A pixel defining layer including an opening that exposes the anode may be formed at a boundary of each pixel. As will be described later, organic light-emitting ink may be ejected onto the anode exposed by the pixel defining layer. A hole injection layer and/or a hole transport layer may be formed on the anode. In this case, the organic light-emitting ink may be ejected onto the hole injection layer and/or the hole transport layer disposed on the anode. The pixel defining layer may be function as barrier ribs that prevent the organic light-emitting ink supplied to each pixel from overflowing to a neighboring pixel.

The print head 40 may be placed above the stage 10. Specifically, the print head 40 may be separated from a top surface of the stage 10 and the top surface of the substrate 20 placed on the top surface of the stage 10 by a predetermined distance. In an exemplary embodiment, the print head 40 may be placed to extend in a direction parallel to a first side of the substrate 20. The print head 40 placed to extend parallel to the first side of the substrate 20 may move from above the first side of the substrate 20 to above a second side of the substrate 20. The movement of the print head 40 will be described later.

The print head 40 may include at least one nozzle. If the print head 40 includes a plurality of nozzles 410 through 460, the nozzles 410 through 460 may be arranged in a line along a lengthwise direction of the print head 40 or may be arranged in a matrix of columns and rows. However, the arrangement of the nozzles 410 through 460 is not limited to the above examples. The nozzles 410 through 460 may be arranged in various patterns according to the arrangement pattern of the pixels 210 through 260 on the substrate 20.

The nozzles 410 through 260 may eject organic light-emitting ink 80 onto the substrate 20, more specifically, onto the anodes exposed by the pixel defining layer. The organic light-emitting ink 80 is a raw material used to form an organic light-emitting layer and may include an organic light-emitting material and a solvent. When the solvent evaporates as the organic light-emitting ink 80 ejected onto the substrate 20 dries, the organic light-emitting layer may be formed. The organic light-emitting material may be a red organic light-emitting material, a green organic light-emitting material, or a blue organic light-emitting material. The solvent is used to dissolve the organic light-emitting material into a liquid state. The solvent may be a material that is highly volatile and can mix well with the organic light-emitting material. The organic light-emitting ink 80 may be red ink containing the red organic light-emitting material, green ink containing the green organic light-emitting material or blue ink containing the blue organic light-emitting material. When the solvent evaporates as the red ink, the green ink or the blue ink dries, a red light-emitting layer, a green light-emitting layer or a blue light-emitting layer may be formed.

The nozzles 410 through 460 may be at least one of a red ink ejection nozzle which ejects the red ink, a green ink ejection nozzle which ejects the green ink, and a blue ink ejection nozzle which ejects the blue ink. In an exemplary embodiment, one set of the red ink ejection nozzle (410), the green ink ejection nozzle (420) and the blue ink ejection nozzle (430) may be arranged, and this set may be repeated. In the exemplary embodiment of FIG. 1, two sets of the red ink ejection nozzle (410, 440), the green ink ejection nozzle (420, 450), and the blue ink ejection nozzle (430, 460) may be arranged in a line. The red ink ejection nozzle (410), the green ink ejection nozzle (420), and the blue ink ejection nozzle (430) may be arranged in various orders and patterns.

Although not shown in the drawings, the apparatus 1000 for manufacturing an OLED display according to the current embodiment may include the moving unit which moves the print head 40 or the stage 10. The moving unit may move the print head 40 or the stage 10 and may include, but not limited to, a motor or an actuator. In an exemplary embodiment, the moving unit may move the print head 40 or the stage 10 in a rectilinear reciprocating motion. However, the movement of the print head 40 or the stage 10 is not limited to the rectilinear reciprocating motion.

The cover plate 30 which covers at least part of the top surface of the stage 10 may be placed above the stage 10. Specifically, the cover plate 30 may cover at least part of the top surface of the substrate 20 placed on the stage 10. More specifically, the cover plate 30 may cover at least some of the pixels 210 through 260 disposed on the substrate 20. If the cover plate 30 covers the pixels 210 through 260, in particular, pixels onto which the organic light-emitting ink 80 has been ejected, it can suppress the volatilization of the organic light-emitting ink 80, thereby reducing the drying speed of the organic light-emitting ink 80. In addition, as will be described later, the cover plate 30 sequentially covers the pixels 210 through 260 onto which the organic light-emitting ink 80 has been ejected. Therefore, the cover plate 30 can reduce a difference in drying time between pixels filled first with the organic light-emitting ink 80 and pixels filled later with the organic light-emitting ink 80. Accordingly, the organic light-emitting ink 80 on the whole surface of the substrate 20 can be induced to have a relatively uniform drying profile.

In an exemplary embodiment, the cover plate 30 may be formed of, but not limited to, a glass or plastic material. In addition, in an exemplary embodiment, the cover plate 30 may be formed to have light transmittance.

A guide rail 50 for guiding the movement of the cover plate 30 may be placed on the stage 10 such that the cover plate 30 can move while maintaining a predetermined gap with the stage 10 or the substrate 20. Specifically, the guide rail 50 may be placed on both sides of the stage 10 to protrude from the top surface of the stage 10.

In an exemplary embodiment in which the cover plate 30 is rectangular, the guide rail 50 may be placed to contact both sides of the cover plate 30. The guide rail 50 may include slide grooves 501 in inner side surfaces thereof, such that the cover plate 30 can move while its both sides are inserted into the slide grooves 501. That is, both sides of the cover plate 30 may be held in the guide grooves 501 formed in the guide rail 50. Accordingly, a distance d1 between the cover plate 30 and the substrate 20 or a distance d2 between the cover plate 30 and the stage 10 may be maintained constant. In the drawings, the cover plate 30 and the substrate 20 are separated from each other by a constant distance. However, the present invention is not limited thereto. In an exemplary embodiment, the cover plate 30 and the substrate 20 may at least partially contact each other.

The slide grooves 501 may extend in a first direction. If the slide grooves 501 extend in the first direction, the cover plate 30 may move in the first direction along the slide grooves 501. That is, while both sides of the cover plate 30 are inserted or held in the slide grooves 501, the cover plate 30 may slide along the first direction. The first direction may be the same as the direction in which the print head 40 moves, which will be described later. When the cover plate 30 moves along the slide grooves 501, it may sequentially cover the top surface of the substrate 20. That is, the cover plate 30 may move along the slide grooves 501 from a first side of the substrate 20 to a second side of the substrate 20 while sequentially covering the substrate 20 from the first side of the substrate 20 to the second side of the substrate 20. In this case, the top surface of the substrate 20 may be completely covered by the cover plate 30.

While the guide rail 50 and the slide grooves 501 have been described above as an example of a moving means along which the cover plate 30 moves while being held in the moving means, the scope of the present invention is not limited to this example. That is, the cover plate 30 may sequentially cover the top surface of the substrate 20 using various moving means. In an example, the moving means may include rollers in order to make the cover plate 30 move more easily.

The operation of the apparatus 1000 for manufacturing an OLED display according to the current embodiment will now be described with reference to the attached drawings.

Figure 3:
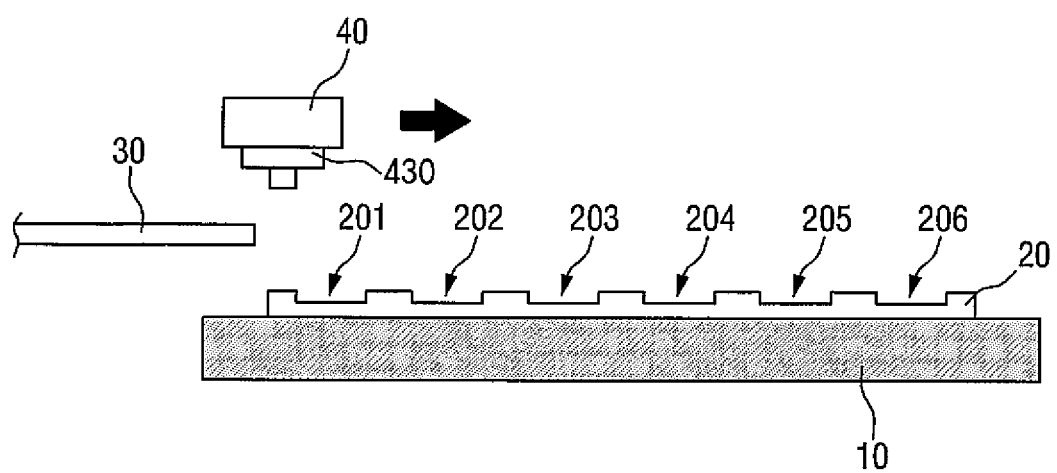
FIGS. 3 through 5 are cross-sectional views taken along the line I-I' of FIG. 1.
Figure 4:
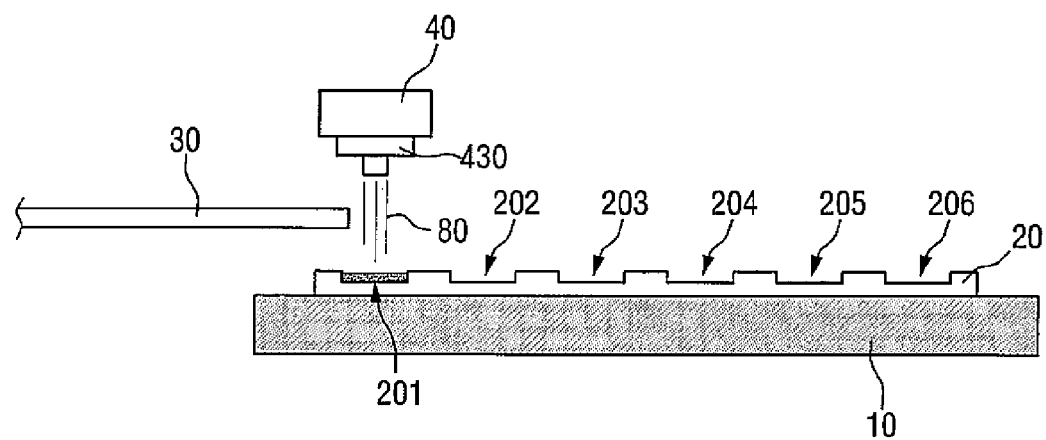
Figure 5:
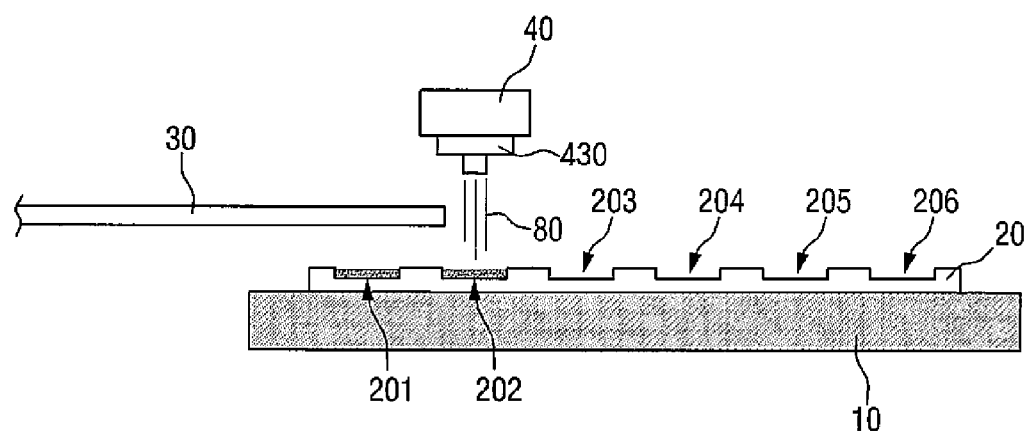

The operation of the apparatus 1000 will be described in detail with reference to FIGS. 3 through 5. FIGS. 3 through 5 are cross-sectional views taken along the line I-I' of FIG. 1, illustrating the movement of the print head 40.

As described above, the moving unit may move the print head 40 or the stage 10. For ease of description, a case where the stage 10 is fixed and the print head 40 moves will be described as an example. However, the scope of the present invention does not exclude a case where the stage 10 moves and the print head 40 is fixed.

Referring to FIG. 3, in the apparatus 1000 for manufacturing an OLED display according to the current embodiment, the print head 40 may move in the first direction. In an exemplary embodiment, the first direction may be, but is not limited to, perpendicular to the lengthwise direction of the print head 40.

As described above, in a state where the lengthwise direction of the print head 40 is parallel to a first side of the substrate 20, the print head 40 may move in a straight line along the first direction. The print head 40 may move while facing the substrate 20. During the movement of the print head 40, a distance between the print head 40 and the substrate 20 may be maintained constant. In addition, the print head 40 may move in a straight line at constant speed. However, the moving speed of the print head 40 is not limited to the constant speed. That is, the moving speed of the print head 40 can be adjusted. To this end, the moving unit may further include a speed adjusting unit (not shown) which adjusts the moving speed of the print head 40.

Referring to FIG. 4, the print head 40 may eject the organic light-emitting ink 80 onto the substrate 20. Specifically, while the print head 40 moves, the nozzles 410 through 460 may eject the organic light-emitting ink 80 toward the substrate 20. The nozzles 410 through 460 may continuously or discontinuously eject the organic light-emitting ink 80. That is, the apparatus 1000 for manufacturing an OLED display according to the current embodiment may be of a line printing type which continuously ejects the organic light-emitting ink 80 or of a dot printing type which discontinuously ejects the organic light-emitting ink 80. For ease of description, a case where the nozzles 410 through 460 discontinuously eject the organic light-emitting ink 80 will be described below as an example.

As described above, the print head 40 may move from above the first side of the substrate 20 to above a second side of the substrate 20. For ease of description, pixels located from a leftmost position to a rightmost position in FIGS. 3 through 5 will be referred to first-row through sixth-row pixels 201 through 206. As the print head 40 moves, the nozzles 410 through 460 of the print head 40 may be located above the first-row pixel 201. When the nozzles 410 through 460 of the print head 40 are located above the first-row pixel 201, they may eject the organic light-emitting ink 80 toward the first-row pixel 201.

Referring to FIG. 5, the print head 40 may move continuously to be located above the second-row pixel 202. Specifically, when the first-row pixel 201 is filled with the organic light-emitting ink 80, the print head 40 may move toward the second-row pixel 202. At the same as or after the first-row pixel 201 is filled with the organic light-emitting ink 80, the cover plate 30 may move in the first direction to cover the first-row-pixel 201. The movement of the cover plate 30 may be continuous or discontinuous.

If the cover plate 30 is placed above a pixel filled with the organic light-emitting ink 80, the concentration of the organic light-emitting ink solvent in the air above the pixel, that is, the atmospheric concentration of the solvent may increase, thereby reducing the drying speed of the organic light-emitting ink 80. That is, since the drying speed of a pixel filled first with the organic light-emitting ink 80 is reduced, a difference in drying time between the pixel filled first with the organic light-emitting ink 80 and a pixel filled later with the organic light-emitting ink 80 can be reduced. Accordingly, the organic light-emitting ink 80 that fills pixels in all regions of the substrate 20 can be induced to have a relatively uniform drying profile.

The print head 40 may continuously move in the first direction. That is, the print head 40 and the cover plate 30 may continuously move in the first direction with a time difference therebetween to finally reach the second side of the substrate 20 via the first through sixth-row pixels 201 through 206. The movement of the print head 40 from the third-row pixel 203 to the sixth-row pixel 206 is substantially the same as the movement of the print head 40 from the first-row pixel 201 to the second-row pixel 202, and thus a redundant description thereof will be omitted.

In FIGS. 3 through 5, a case where a plurality of nozzles are arranged along the lengthwise direction of the print head 40 and where the cover plate 30 sequentially covers the first-row through sixth-row pixels 210 through 206 of the substrate 20 is illustrated as an example. However, the scope of the present invention is not limited to this case. That is, as described above, the print head 40 may also eject the organic light-emitting ink 80 simultaneously to a plurality of rows of pixels depending on the arrangement pattern of the nozzles, and the cover plate 30 may cover pixels filled with the organic light-emitting ink 80 as the print head 40 moves.

Hereinafter, other embodiments of the present invention will be described. In the following embodiments, elements substantially identical to those described above are indicated by like reference numerals, and thus a redundant description thereof will be omitted or simplified.

Figure 6:
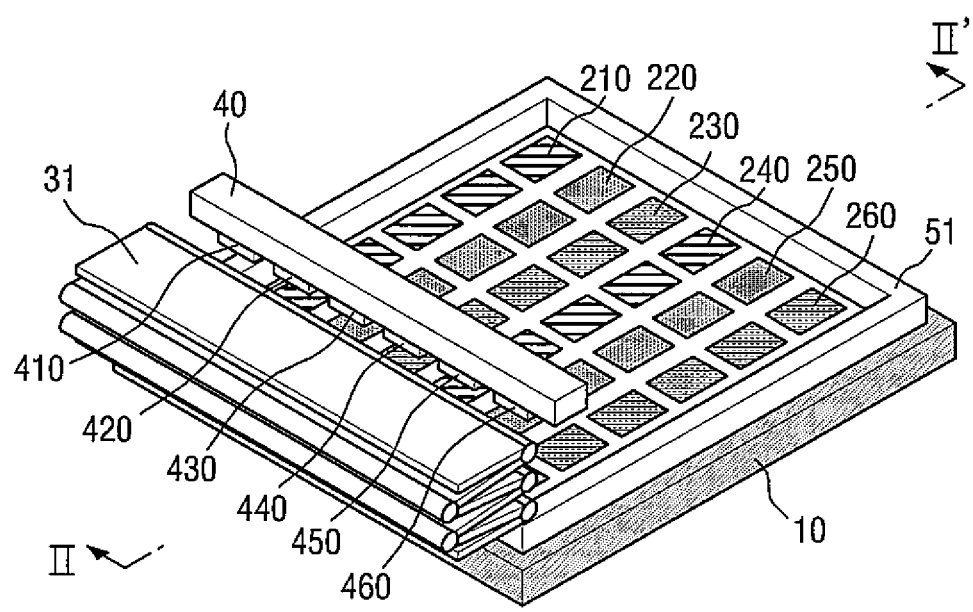
FIG. 6 is a perspective view of an apparatus for manufacturing an OLED display according to another embodiment of the present invention.

FIG. 6 is a perspective view of an apparatus 1001 for manufacturing an OLED display according to another embodiment of the present invention.

Referring to FIG. 6, the apparatus 1001 for manufacturing an OLED display according to the current embodiment is different from the apparatus 1000 according to the embodiment of FIG. 1 in that a frame 51 is placed on a stage 10 to surround the outside of a substrate 20 and that a folding cover plate 31 is placed on the frame 51.

The frame 51 may be placed on the stage 10. In an exemplary embodiment, the frame 51 may be shaped like a rectangle with a through hole. However, the shape of the frame 51 is not limited to this example. In addition, a height from a top surface of the stage 10 to a top surface of the frame 51 may be greater than or substantially equal to a height from the top surface of the stage 10 to a top surface of the substrate 20. In an exemplary embodiment in which the cover plate 31 and the substrate 20 are separated from each other by a constant distance, it is obvious that the height from the top surface of the stage 10 to the top surface of the frame 51 is greater than the top surface of the stage 10 to the top surface of the substrate 20.

The frame 51 may be placed to surround the outside of the substrate 20. However, the present invention is not limited thereto, and at least one side of the frame 51 can be open. In an example, the frame 51 may be shaped like '⊏' having one open side or like '11' having two open sides.

The folding cover plate 31 may be placed on the frame 51. The folding cover plate 31 will be described in greater detail with reference to FIGS. 7 and 8.

Figure 7:
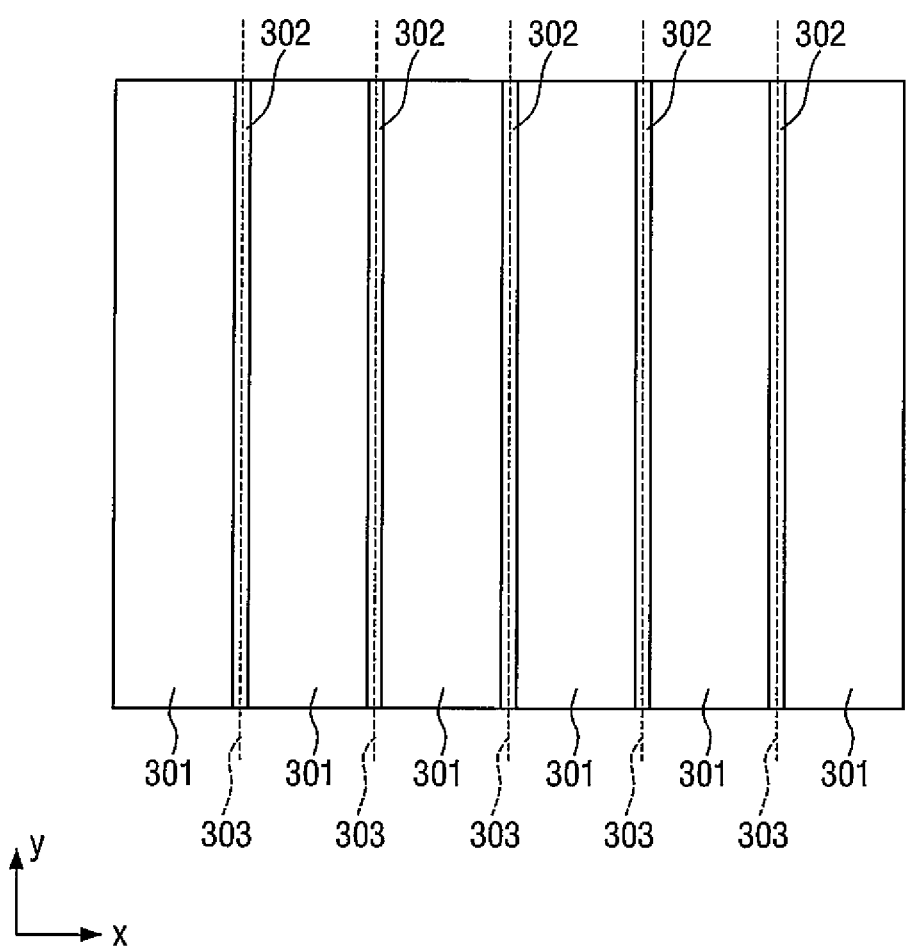
FIG. 7 is a plan view of a cover plate included in the apparatus for manufacturing an OLED display according to the embodiment of FIG. 6.
Figure 8:
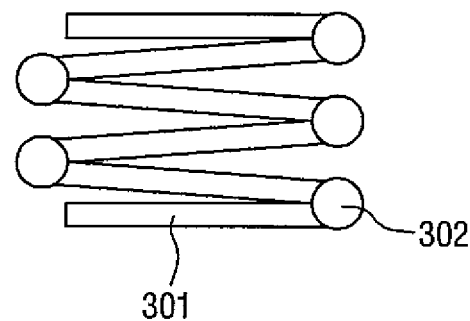
FIG. 8 is a side view of the cover plate shown in FIG. 7.

FIG. 7 is a plan view of the cover plate 31 included in the apparatus 1001 for manufacturing an OLED display according to the embodiment of FIG. 6, and FIG. 8 is a side view of the cover plate 31 shown in FIG. 7.

Referring to FIGS. 7 and 8, the cover plate 31 may include a plurality of unit cover plates 301, and the unit cover plates 301 may be hinge-connected to each other.

Specifically, the unit cover plates 301 may be arranged side by side along an x direction in FIG. 7. In addition, both sides of each unit cover plate 301, excluding the outermost unit cover plates 301, may be hinge-coupled to other adjacent unit cover plates 301. One side of each of the outermost unit cover plates 301 may be hinge-coupled to another adjacent unit cover plate 301. If the unit cover plates 301 are arranged side by side and hinge-coupled to each other as described above, the cover plate 31 can be folded such that the unit cover plates 301 overlap each other, and the folded cover plate 31 can be sequentially unfolded. In this case, a folding line 303 may be defined between each unit cover plate 301 and an adjacent unit cover plate 301. That is, the cover plate 31 may be folded along the folding lines 303 such that each unit cover plate 301 can overlap another adjacent unit cover plate 301.

In FIG. 8, the cover plate 31 is folded along the folding lines 303 such that the unit cover plates 301 overlap each other is illustrated. For ease of description, a state where all of the unit cover plates 301 overlap each other as in FIG. 8 will be referred to as an 'initial state.' The cover plate 31 in the initial state may be sequentially unfolded. In an exemplary embodiment, the cover plate 31 in the initial state may be unfolded in a direction orthogonal to the folding lines 303. The specific operation of the cover plate 31 will now be described with reference to FIGS. 9 through 11.

Figure 9:
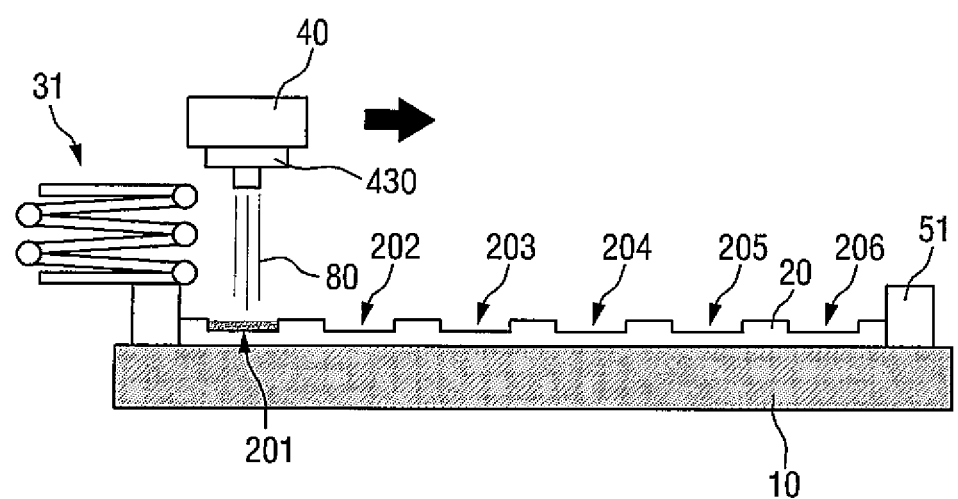
FIGS. 9 through 11 are cross-sectional views taken along the line II-II' of FIG. 6.
Figure 10:
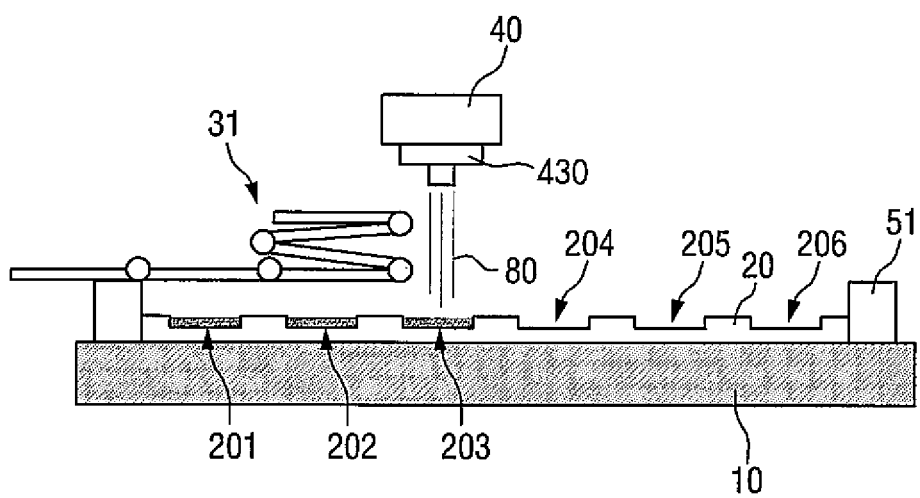
Figure 11:
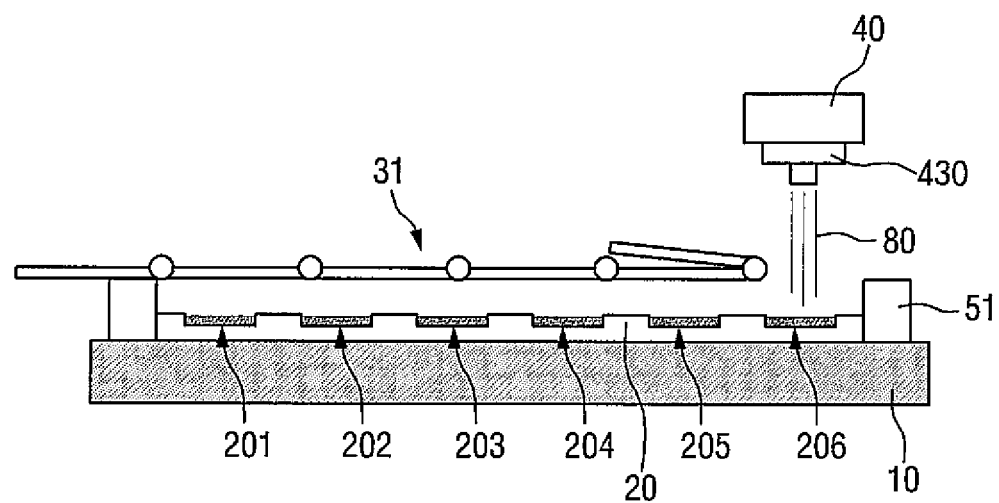

FIGS. 9 through 11 are cross-sectional views illustrating the operation of the apparatus 1001 for manufacturing an OLED display according to the embodiment of FIG. 6.

Referring to FIGS. 9 through 11, the cover plate 31 in the initial state may be placed on a top surface of a side of the frame 51. As described above, a print head 40 may move in a first direction. The specific movement of the print head 40 is substantially the same as the movement of the print head 40 described above with reference to FIGS. 3 through 5, and thus a detailed description thereof will be omitted.

As the print head 40 moves while ejecting organic light-emitting ink 80 onto pixels 201 through 206, the cover plate 31 may cover top surfaces of pixels filled with the organic light-emitting ink 80. Specifically, the cover plate 31 in the initial state may be sequentially unfolded in a direction orthogonal to the folding lines 303, that is, in the first direction in which the print head 40 moves. As described above, the print head 40 may move from above a first side of the substrate 20 to above a second side of the substrate 20, and, accordingly, the cover plate 31 may be unfolded sequentially from a top surface of a side of the frame 51 toward a top surface of the other side of the frame 51. That is, the cover plate 31 may cover the top surface of the substrate 20 sequentially from the first side of the substrate 20 to the second side of the substrate 20. When the cover plate 31 is completely unfolded, it may completely cover the top surface of the substrate 20. In other words, the cover plate 31 may completely cover a top surface of the through hole of the frame 51. In this case, the substrate 20 may be enclosed by the top surface of the stage 10, the frame 51 and the cover plate 31. In other words, an enclosed space surrounded by the top surface of the stage 10, the frame 51 and the cover plate 31 may be formed, and the substrate 20 may be placed within the enclosed space. If the substrate 20 is enclosed by the top surface of the stage 10, the frame 51 and the cover plate 31, the concentration of an organic light-emitting ink solvent in the air adjacent to pixels 210 through 260 of the substrate 20 increases, thereby reducing the drying speed of the organic light-emitting ink 80 that fills each of the pixels 210 through 260 of the substrate 20. In other words, the drying speed of the organic light-emitting ink 80 can be maintained relatively uniformly across all regions of the substrate 20.

Figure 12:
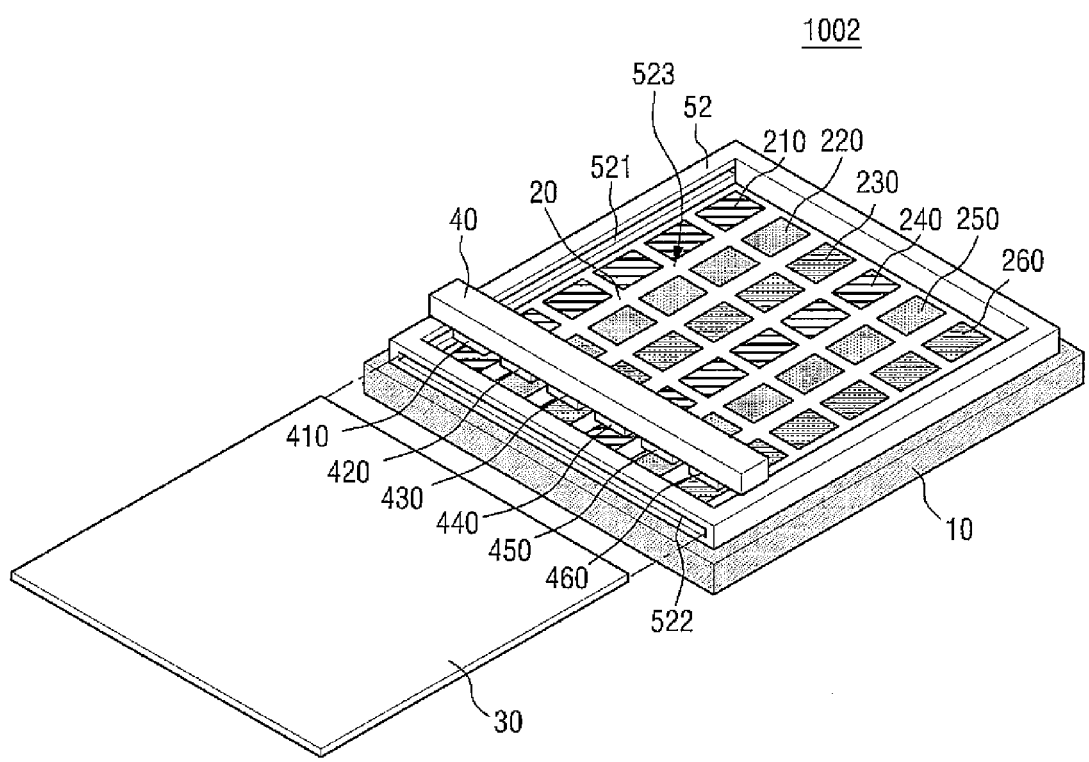
FIG. 12 is a perspective view of an apparatus for manufacturing an OLED display according to another embodiment of the present invention.

FIG. 12 is a perspective view of an apparatus 1002 for manufacturing an OLED display according to another embodiment of the present invention.

Referring to FIG. 12, the apparatus 1002 for manufacturing an OLED display according to the current embodiment is different from the apparatus 1000 according to the embodiment of FIG. 1 in that it further includes a frame 52 placed on a stage 10 and that a cover plate 30 is inserted into the frame 52.

The frame 52 may be placed on the stage 10. In an exemplary embodiment, the frame 52 may be shaped like a rectangle with a through hole. However, the shape of the frame 52 is not limited to this example.

The frame 52 may be placed to surround the outside of a substrate 20. However, the present invention is not limited thereto, and at least one side of the frame 52 can be open. In an example, the frame 52 may be shaped like 'ㄷ' having one open side or like '11' having two open sides.

A housing space 523 for housing the cover plate 30 may be formed in the frame 52. The size of the housing space 523 may be substantially equal to or greater than that of the cover plate 30.

Slide grooves 521 may be formed in inner side surfaces of the housing space 523 which face each other, such that the cover plate 30 can be inserted into the slide grooves 521 and slide along the slide grooves 521. The slide grooves 521 may extend along a first direction. If the slide grooves 521 extend along the first direction, the cover plate 30 inserted into the frame 52 may move in the first direction along the slide grooves 521.

An opening 522 connected to the housing space 523 may be formed at respective ends of the slide grooves 521. That is, the cover plate 30 may be inserted into the housing space 523 inside the frame 52 through the opening 522 and then move in the first direction along the slide grooves 521 connected to the opening 522.

The apparatus 1002 for manufacturing an OLED display according to the current embodiment may operate in substantially the same way as described above with reference to FIGS. 3 through 5. That is, the cover plate 30 inserted into the frame 52 may follow the print head 40 moving in the first direction so as to cover top surfaces of pixels filled with organic light-emitting ink. As described above, the print head 40 may move from above a first side of the substrate 20 to above a second side of the substrate 20. Accordingly, the cover plate 30 may slide from above the first side of the substrate 20 to above the second side of the substrate 20. When the cover plate 30 is completely inserted into the frame 52, it may completely cover a top surface of the substrate 20. In this case, the substrate 20 may be enclosed by a top surface of the stage 10, the frame 52, and the cover plate 30. In other words, an enclosed space surrounded by the top surface of the stage 10, the frame 52 and the cover plate 30 may be formed, and the substrate 20 may be placed within the enclosed space.

If the substrate 20 is enclosed by the top surface of the stage 10, the frame 52 and the cover plate 30, the concentration of an organic light-emitting ink solvent in the air adjacent to pixels 210 through 260 of the substrate 20 increases, thereby reducing the drying speed of the organic light-emitting ink that fills each of the pixels 210 through 260 of the substrate 20. In other words, the drying speed of the organic light-emitting ink can be maintained relatively uniformly across all regions of the substrate 20.

Figure 13:
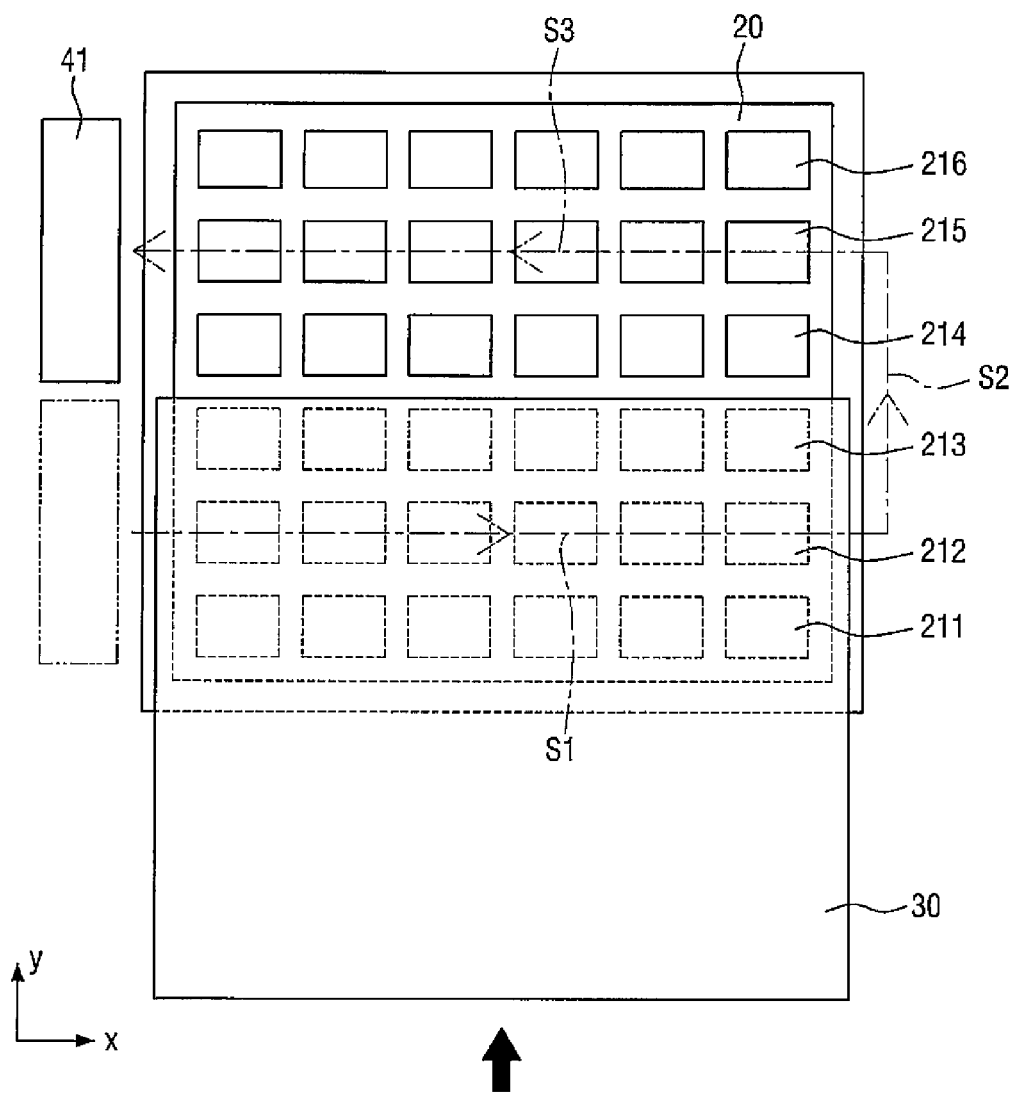
FIG. 13 is a plan view of an apparatus for manufacturing an OLED display according to another embodiment of the present invention.

FIG. 13 is a plan view of an apparatus for manufacturing an OLED display according to another embodiment of the present invention. Referring to FIG. 13, a print head 41 of the apparatus for manufacturing an OLED display according to the current embodiment may be shorter than a side of a substrate 20. In this case, the print head 41 may move over the substrate 20 a number of times. As described above, the print head 41 may move from above a first side of the substrate 20 to above a second side of the substrate 20. The print head 41 arriving at the second side of the substrate 20 after moving in a first direction s1 from the first side of the substrate 20 may make a rectilinear motion in a second direction s2 different from the first direction s1. While the print head 41 is moving in the second direction s2, the ejection of organic light-emitting ink from nozzles may be temporarily stopped. The print head 41 that has moved a certain distance in the second direction s2 may move in a third direction s3 different from the second direction s2. In an exemplary embodiment, the third direction s3 may be orthogonal to the second direction s2 and parallel to the first direction s1. As described above, more pixels than pixels shown in the drawing may be formed on the substrate 20. If more pixels than the pixels shown in the drawing are formed on the substrate 20, the print head 41 may perform the above operation more than once. That is, the print head 41 may coat a plurality of pixels on the substrate 20 with organic light-emitting ink by repeatedly moving in the first, second and third directions s1, s2 and s3. When the print head 41 sequentially moves in the first, second and third directions s1, s2 and s3, a cover plate 30 may move along the second direction s2 from the first side of the substrate 20. That is, in an exemplary embodiment, the print head 41 may move in the first direction s1 to coat first-row through third-row pixels 211 through 213 with the organic light-emitting ink. When the print head 41 moves in the second direction s2, the cover plate 30 may cover top surfaces of the first-row through third-row pixels 211 through 213 coated with the organic light-emitting ink. If the print head 41 repeats the above motion, the cover plate 30 may also continuously move along the second direction s2. When the print head 41 coats all pixels on the substrate 20 with the organic light-emitting ink, the cover plate 30 moving along the second direction s2 may continuously move to reach the second side of the substrate 20. In this case, the cover plate 30 may completely cover all regions of the substrate 20.

A method of manufacturing an OLED display according to an embodiment of the present invention will now be described. The method of manufacturing an OLED display according to the current embodiment includes placing a substrate 20 having rows and columns of pixels 210 through 260 on a stage 10, ejecting organic light-emitting ink 80 to the pixels 210 through 260 on the substrate 20 by using a print head 40 placed above the stage 10, and sequentially covering pixels 210 through 260 coated with the organic light-emitting ink 80 with a cover plate 30 placed above the stage 10.

The method of manufacturing an OLED display according to the current embodiment may be performed by the apparatuses for manufacturing an OLED display according to the above-described embodiments of the present invention. However, the present invention is not limited thereto.

The substrate 20 having the rows and columns of pixels 210 through 260 may be placed on the stage 10. The stage 10 and the substrate 20 are substantially the same as those included in the apparatuses for manufacturing an OLED according to the above-described embodiments of the present invention, and thus a description thereof will be omitted.

Once the substrate 20 is placed on the stage 10, the print head 40 may eject the organic light-emitting ink 80 to the pixels 210 through 260 of the substrate 20. Specifically, nozzles 410 through 460 included in the print head 40 may eject the organic light-emitting ink 80. This may be substantially the same as described above in the apparatuses for manufacturing an OLED display according to the embodiments of the present invention.

In the ejecting of the organic light-emitting ink 80 to the pixels 210 through 260 on the substrate 20, the print head 40 may eject the organic light-emitting ink 80 while moving in a first direction. As the print head 40 moves, the cover plate 30 may move in the first direction to sequentially cover top surfaces of pixels coated with the organic light-emitting ink 80. The print head 40 moving in the first direction may eject the organic light-emitting ink 80 discontinuously or continuously as described above with reference to FIGS. 3 through 5.

A method of manufacturing an OLED display according to another embodiment of the present invention will now be described. The method of manufacturing an OLED display according to the current embodiment is different from the method of manufacturing an OLED display according to the previous embodiment in that a print head 41 moves sequentially in a first direction s1, a second direction s2 orthogonal to the first direction s1, and a third direction s3 parallel and opposite to the first direction s1 and that a cover plate 30 moves along the second direction s2 as the print head 41 moves.

The method of manufacturing an OLED display according to the current embodiment may be performed by the apparatuses for manufacturing an OLED display according to the above-described embodiments of the present invention. As described above with reference to FIG. 13, the print head 41 may move sequentially in the first direction s1, the second direction s2 and the third direction s3 and may repeat the above movement. As the print head 41 moves, the cover plate 30 may move along the second direction s2 from a first side of a substrate 20. That is, in an exemplary embodiment, the print head 41 may coat first-row through third-row pixels 211 through 213 with organic light-emitting ink 80 by moving in the first direction s1. When the print head 41 moves in the second direction s2, the cover plate 30 may cover top surfaces of the first-row through third-row pixels 211 through 213 coated with the organic light-emitting ink 80. If the print head 41 repeats the above motion, the cover plate 30 may also continuously move along the second direction s2. When the print head 41 coats all pixels on the substrate 20 with the organic light-emitting ink 80, the cover plate 30 moving along the second direction s2 may continuously move to reach a second side of the substrate 20. In this case, the cover plate 30 may completely cover all regions of the substrate 20.

Embodiments of the present invention provide at least one of the following advantages.

That is, it is possible to reduce a difference in drying time of organic light-emitting ink on all regions of a substrate.

In addition, since the difference in drying time can be reduced, the organic light-emitting ink can be induced to have a relatively uniform drying profile on all regions of the substrate.

Accordingly, an OLED display having improved display quality can be manufactured.

However, the effects of the present invention are not restricted to the one set forth herein. The above and other effects of the present invention will become more apparent to one of daily skill in the art to which the present invention pertains by referencing the claims.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method of manufacturing an organic light-emitting diode (OLED) display, the method comprising:
    placing a substrate having rows and columns of pixels on a stage;
    ejecting organic light-emitting ink to the pixels on the substrate by using a print head placed above the stage; and
    sequentially covering pixels, to which the organic light-emitting ink has been ejected, with a cover plate placed above the stage and spaced apart from the ejected organic light-emitting ink.

2. The method of claim 1, wherein in the ejecting of the organic light-emitting ink to the pixels on the substrate by using the print head, the print head moves sequentially in a first direction, a second direction orthogonal to the first direction, and a third direction parallel and opposite to the first direction, and the cover plate sequentially covers the top surface of the substrate by moving in the second direction as the print head moves.

3. The method of claim 2, wherein the print head ejects the organic light-emitting ink discontinuously or continuously.

4. The method of claim 1, wherein in the ejecting of the organic light-emitting ink to the pixels on the substrate by using the print head, the print head ejects the organic light-emitting ink as the stage moves in a first direction, and the cover plate sequentially covers a top surface of the substrate as the stage moves.

5. The method of claim 4, wherein the print head ejects the organic light-emitting ink discontinuously or continuously.

6. A method of manufacturing an organic light-emitting diode (OLED) display, the method comprising:
    placing a substrate having rows and columns of pixels on a stage;
    ejecting organic light-emitting ink to the pixels on the substrate by using a print head placed above the stage; and
    sequentially covering pixels, to which the organic light-emitting ink has been ejected, with a cover plate placed above the stage,
    wherein in the ejecting of the organic light-emitting ink to the pixels on the substrate by using the print head, the print head ejects the organic light-emitting ink by moving in a first direction, and the cover plate sequentially covers a top surface of the substrate by moving in the first direction as the print head moves.

7. The method of claim 6, wherein the print head moves in the first direction and ejects the organic light-emitting ink discontinuously or continuously.

8. A method of manufacturing an organic light-emitting diode (OLED) display, the method comprising:
   placing a substrate having rows and columns of pixels on a stage;
   ejecting organic light-emitting ink to the pixels on the substrate by using a print head placed above the stage; and
   sequentially covering pixels, to which the organic light-emitting ink has been ejected, with a cover plate placed above the stage,
   wherein in the ejecting of the organic light-emitting ink to the pixels on the substrate by using the print head, the print head moves sequentially in a first direction, a second direction orthogonal to the first direction, and a third direction parallel and opposite to the first direction, and the cover plate sequentially covers the top surface of the substrate by moving in the second direction as the print head moves.

9. The method of claim 8, wherein the print head ejects the organic light-emitting ink discontinuously or continuously.

* * * * *